US006525682B2

(12) United States Patent
Yap et al.

(10) Patent No.: US 6,525,682 B2
(45) Date of Patent: Feb. 25, 2003

(54) PHOTONIC PARALLEL ANALOG-TO-DIGITAL CONVERTER

(75) Inventors: Daniel Yap, Thousand Oaks, CA (US); Robert H. Walden, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 09/848,499

(22) Filed: May 3, 2001

(65) Prior Publication Data

US 2002/0163454 A1 Nov. 7, 2002

(51) Int. Cl.[7] .............................................. H03M 1/12
(52) U.S. Cl. ...................................... 341/137; 341/155
(58) Field of Search ................................. 341/137, 120, 341/155, 159; 250/225

(56) References Cited

U.S. PATENT DOCUMENTS

| 5,010,346 | A | | 4/1991 | Hamilton et al. ............ 341/137 |
| 5,111,517 | A | | 5/1992 | Riviere ......................... 385/11 |
| 5,196,852 | A | | 3/1993 | Galton ......................... 341/143 |
| 5,253,309 | A | | 10/1993 | Nazarathy et al. ............. 385/4 |
| 5,955,875 | A | | 9/1999 | Twichell et al. .............. 324/96 |
| 6,326,910 | B1 | * | 12/2001 | Hayduk ........................ 341/155 |
| 6,422,985 | B1 | * | 7/2002 | Toughlian ................... 341/137 |

FOREIGN PATENT DOCUMENTS

| EP | 0 403 991 | 12/1990 |
| EP | 0 484 791 | 5/1992 |

OTHER PUBLICATIONS

Pace, Phillip E. and Powers, John P., *Photonic Sampling of RF and Microwave Signals*, U.S. Naval Postgraduate School (1998).

Jensen, J.F., et al., "A 3.2–Ghz Second–Order Delta–Sigma Modular Implemented in InP HBT Technology," *IEEE Journal of Solid–State Circuits*, vol. 30, No. 10, pp. 1119–1127 (1995).

Galton, Ian and Jensen, Henrik T., "Delta–Sigma Modulator Based A/D Conversion without Oversampling," *IEEE Trans. on Circuits and Systems II: Analog and Digital Signal Processing*, vol. 42, No. 12, pp. 773–784, (1995).

Bridges, William B. and Schaffner, James H., "Distortion in Linearized Electrooptic Modulators," *IEEE Trans. on Microwave Theory and Techniques*, vol. 43, No. 9, pp. 2184–2197 (1995).

Korotky, Steven K. and Riddler, Rene M., "Dual Parrallel Modulation Schemes for Low–Distortion Analog Optical Transmission," *IEEE Journal on Selected Areas in Communications*, vol. 8, No. 7, pp. 1377–1380 (1990).

Schiller, Chris and Byrne, Pat, "A 4–Ghz 8–b ADC System," *IEEE Journal of Solid–State Circuits*, vol. 26, No. 12, pp. 1781–1789 (1991).

Pace, Phillip E., et al., "Integrated Optical Sigma–Delta Modulators," *Optical Engineering*, vol. 35, No. 7, pp. 1828–1836 (1996).

* cited by examiner

*Primary Examiner*—Brian Young
(74) *Attorney, Agent, or Firm*—Ladas & Parry

(57) ABSTRACT

A photonically sampled analog-to-digital converter using parallel channels of sampling and quantizing. The parallel combination achieves cancellation of the spurs that result from the nonlinear transfer function of the samplers. The samplers feed a dual-detector optoelectronic receiver that has differential inputs for suppression of laser intensity noise. The outputs of the multiple photonic samplers are averaged to reduce the effects of shot or thermal noise from the optoelectronic receiver of a sampler. The errors produced by the quantization process can be reduced by using a delta-sigma modulator-based analog-to-digital convertor as the quantizer which provides noise-spectrum shaping and filtering.

37 Claims, 7 Drawing Sheets

PHOTONIC PARALLEL ANALOG-TO-DIGITAL CONVERTER

CROSS-REFERENCE TO RELATED APPLICATIONS

The present document is related to the copending and commonly assigned patent application document entitled "Photonic Encoding Sampler," Ser. No. 09/848,498, which is filed of even date herewith. The contents of this related application are hereby incorporated by reference herein.

FIELD OF THE INVENTION

The present application relates to an apparatus and method for analog-to-digital conversion, and more specifically to a parallel analog-to-digital converter system utilizing photonic sampling.

BACKGROUND OF THE INVENTION

Analog-to-digital conversion is well known as a process in which a continuous time analog signal, which theoretically has an infinite number of values or states, is converted to a digital signal, which has a finite number of values or states. Typically, in analog-to-digital conversion, the analog signal is first sampled. The sampled analog signal is represented as a series of pulses. Each pulse has a magnitude equal to the magnitude of the analog signal at a discrete moment in time. After sampling, the discrete time signal is then quantized by rounding the value of each pulse to the closest one of a finite number of values. The resulting signal is a digital version of the analog signal.

One byproduct of analog-to-digital conversion is quantization noise. Quantization noise occurs because the magnitude of the analog signals entering a quantizer can theoretically be equal to an infinite number of values, whereas the magnitude of the rounded signals leaving the quantizer can only be equal to a finite number of values. Therefore, the quantizer causes a rounding off error, or quantization noise.

One way to reduce quantization noise is through oversampling. It is well known that to recover a sampled analog signal, the signal must be sampled at a rate greater than or equal to twice the signal frequency. Oversampling refers to sampling the signal at a rate much greater than twice the signal frequency. Increasing the sampling frequency spreads the quantization noise over a larger bandwidth because the total amount of quantization noise remains the same over the different sampling bandwidths. Thus, increasing the sampling rate relative to twice the signal frequency, or oversampling, reduces the quantization noise in the bandwidth of interest.

One ADC architecture well known in the art that uses over-sampling is the delta-sigma modulator-based ADC. A delta-sigma ($\Delta\Sigma$) modulator consists of an analog filter and a quantizer enclosed in a feedback loop. The filter, in conjunction with the feedback loop, acts to attenuate the quantization noise at low frequencies while amplifying the high-frequency noise. Since the signal is oversampled at a rate much greater than twice the signal frequency, a digital lowpass filter can be used to remove the high frequency quantization noise without affecting the signal.

A problem with $\Delta\Sigma$ modulator-based ADCs is the oversampling requirement, that is, the circuitry of the ADC must be designed to operate at a significantly higher frequency than the maximum frequency of the analog signal that is converted by the ADC. The greater the required accuracy of the $\Delta\Sigma$ modulator-based ADC, the larger the sampling frequency must be. Limitations in circuitry capabilities have, therefore, limited the use of the single channel $\Delta\Sigma$ modulator-based ADCs to relatively low signal frequencies. However, the sampling frequency may be reduced by using multiple $\Delta\Sigma$ modulators in parallel. An ADC using multiple $\Delta\Sigma$ modulators is disclosed in U.S. Pat. No. 5,196,852, "Analog-To-Digital Converter Using Parallel $\Delta\Sigma$ Modulators," issued Mar. 23, 1993 to I. A. Galton.

As shown in FIG. 1, Galton discloses an all-electronic ADC comprised of multiple parallel channels, each of which operates on the same analog input signal, and the outputs of which are summed to produce the overall digital output. Each channel is comprised of a multiplier 101 that multiplies its input by an internally generated sequence u(n) followed by a $\Delta\Sigma$ modulator 111. The output of each $\Delta\Sigma$ modulator 111 is filtered by a digital low pass filter 112 followed by an N-sample decimator 113. Another multiplier 121 multiplies the decimated output by another internally generated sequence v(n). The first multiplier 101 and the $\Delta\Sigma$ modulator 111 can be considered as mostly analog functions, while the lowpass filter 112, decimator 113, and second multiplier 121 are digital functions. The internally generated sequences are derived from a Hadamard matrix, in which the multipliers use factors of +1 or −1. The ADC disclosed by Galton provides significant levels of ADC accuracy using a sampling frequency as low as twice the signal frequency. The ADC accuracy is increased by using additional channels.

A difficulty associated with sampling, however, is that temporal jitter in the occurrence of the sampling clock limits the performance of the ADC by causing non-uniform sampling and therefore increases the total error power in the quantizer output. If the clock jitter is assumed to contribute white noise, the total power of the error is reduced in an ADC by the oversampling ratio. Nevertheless, the clock jitter still can be a limiting factor for conversion of wideband signals.

Fortunately, sampling jitter limitations can be overcome by using photonic sampling. Photonic sampling makes use of ultra-short laser pulses with high temporal stability to sample an analog electrical input. Compared to electronic samplers, the photonic approach is capable of shorter sampling windows (sub-picosecond) and higher sampling rates, approaching 100 gigasamples per second (GSPS), and thus can sample wideband analog inputs.

A conventional photonically sampled A/D converter 200 is shown in FIG. 2. A series of optical impulses 201 from a mode-locked laser 203 are applied to an electro-optic modulator 205. The analog electrical input X(t) is also applied to the modulator 205. The optical impulses 201 sample the voltage on the modulator 205 electrodes. The resultant optical pulses 207, with intensities determined by the modulator 205 voltage, are fed to a photodetector 209. The photodetector 209 electrical output 211 is an electrical current, which can be supplied to the input of an electronic quantizer 212.

The above approach achieves very high sampling rates because the pulse repetition rate of the mode-locked laser can be 40 GHz or higher. Even higher repetition rates for the optical sampling pulses can be achieved by combining several time-delayed copies of each laser pulse.

Another example of a photonic sampled A/D converter, described by P. E. Pace and J. P. Powers of the U.S. Naval Postgraduate School in "Photonic Sampling of RF and Microwave Signals," Mar. 16, 1998, is illustrated in FIG. 3. The A/D converter of FIG. 3 uses a delta-sigma modulator architecture, which is well known for reducing quantization noise, as described by Galton, with a photonic sampler. The delta-sigma converter 300 contains a mode-locked fiber laser 302 to act as the source of sampling pulses, and two photonic samplers 304, which are Mach-Zehnder interferometric modulators. The fiber-lattice structure 306 acts as an optical integrator. The photonic samplers 304 also serve as the analog summing point at the input of the delta-sigma loop.

One difficulty associated with the photonic A/D converters discussed above is high non-linearity and noise spurs. The dynamic range of the photonic sampler limits prior A/D converters using photonic sampling techniques. For example, an analog waveform with a 5 GHz bandwidth can only be sampled to a resolution of 7.5 bits because the spur-free dynamic range of such modulators is approximately 110 dB-$HZ^{2/3}$. Therefore, what is needed is an A/D converter system that can utilize optical sampling without being adversely affected by the noise and distortion from the photonic sampler.

SUMMARY OF THE INVENTION

An object of the present invention is to provide a method and apparatus for using optical sampling to provide for analog-to-digital conversion of an analog signal. An additional object of the present invention is to provide such conversion while reducing the noise and distortion associated with optically sampling an analog signal.

The photonic ADC system of the present invention overcomes the difficulties associated with photonic sampling by incorporating multiple photonic samplers in a modified parallel A/D converter architecture. In addition, the dynamic range of the photonic sampling process is improved by averaging and by canceling the common-mode laser noise with the dual-complementary photodetection. Prescribed weights can be applied digitally to the parallel channels for cancellation of sampler spurs and to compensate for non-uniformity between the samplers. Thus, the photonic A/D converter system of the present application achieves an improved resolution, as determined by the signal-to-noise and spur free dynamic range, and bandwidth over what can be achieved with a conventional combination of a photonic sampler and a separate electronic ADC.

One embodiment of the present invention provides an analog to digital converter having an analog input and a digital output, said analog to digital converter comprising: an optical pulse source; a plurality of channels, each channel comprising: an optical encoding sampler, coupled to said optical pulse source and said analog input, sampling said analog input to produce a sampled optical signal and encoding said sampled optical signal with an encoding code sequence to produce an encoded optical signal; an optical to electric converter, coupled to said optical encoding sampler, converting said encoded optical signal to an electronic signal; a quantizer, coupled to said optical to electric converter, producing a digital signal from said electronic signal; and a digital decoder, coupled to said quantizer, decoding said digital signal with a decoding code sequence to produce a decoded digital signal; and a summer, coupled to said digital decoder in each channel of said plurality of channels, digitally summing each decoded digital signal from each channel to produce said digital output. Preferably, the optical encoding sampler comprises a Mach-Zehnder interferometer to which the analog signal is applied and a directional coupler to which the encoding sequence is applied. The encoding sequence is preferable a Hadamard sequence. A Nyquist filter may be used after the optical-to-electric converter and a digital noise reduction filter may be used before the digital decoder. Preferably, a delta-sigma modulator is used for the quantizer, due to the additional noise shaping capability provided by the delta-sigma modulator architecture.

Another embodiment of the present invention is provided by an analog to digital converter having an analog input and a digital output, the analog to digital converter comprising: means for producing optical pulses; a plurality of channels, each channel comprising: means for sampling and encoding the analog input with the optical pulses, thereby producing an encoded optical signal; means for converting the encoded optical signal to an electric signal; means for quantizing the electric signal, thereby producing a digital signal; and means for decoding the digital signal with a decoding code sequence, thereby producing a decoded digital signal; and means for summing together each decoded digital signal from each channel in the plurality of channels, thereby producing the digital output. The means for sampling and encoding the analog input may comprise an optical encoding sampler circuit, an integrated optical encoding sampler, or other means that modulate a stream of optical pulses with both an analog signal and a encoding signal. The encoding signal is preferably a Hadamard sequence. The means for quantizing the electric signal may comprise a delta-sigma modulator, a flash analog-to-digital converter, successive approximation converters, or other such quantization means known in the art.

Another embodiment of the present invention is provided by a method for converting an analog input signal to a digital output signal, the method comprising the steps of: providing optical pulses; coupling the optical pulses to a plurality of converter channels; converting the optical pulses coupled to each channel converter channel to encoded optical samples of the analog input signal; converting the encoded optical samples to an electric signal in each converter channel; quantizing the electric signal to produce a quantized digital signal in each converter channel; decoding the quantized digital signal with a decoding code sequence to produce a decoded digital signal in each converter channel; and summing together all the decoded digital signals from each converter channel to produce the digital output signal.

DETAILED DESCRIPTION

The ADC architecture of this invention incorporates parallel combinations of sampling units (the modulators) to achieve cancellation of spurs that result from the nonlinear transfer function of a modulator. Each modulator feeds a dual-detector optoelectronic receiver that has differential inputs for suppression of the laser intensity noise. Also, the outputs of multiple photonic samplers are averaged to reduce the effects of shot or thermal noise from the optoelectronic receiver of a sampler. In addition to suppressing the noise and distortion components (spurs) associated with the sampling process, the errors produced by the quantization process can also be suppressed by utilizing the noise-spectrum shaping and filtering capabilities of a parallel delta-sigma architecture.

The present invention incorporates multiple photonic sampler channels into a parallel A/D converter architecture. The embodiments described herein will be described as utilizing delta-sigma A/D converters in the sampler channel. Nevertheless, those skilled in the art will recognize that other A/D converters, such as flash ADCs may be used as well.

Figure 4:
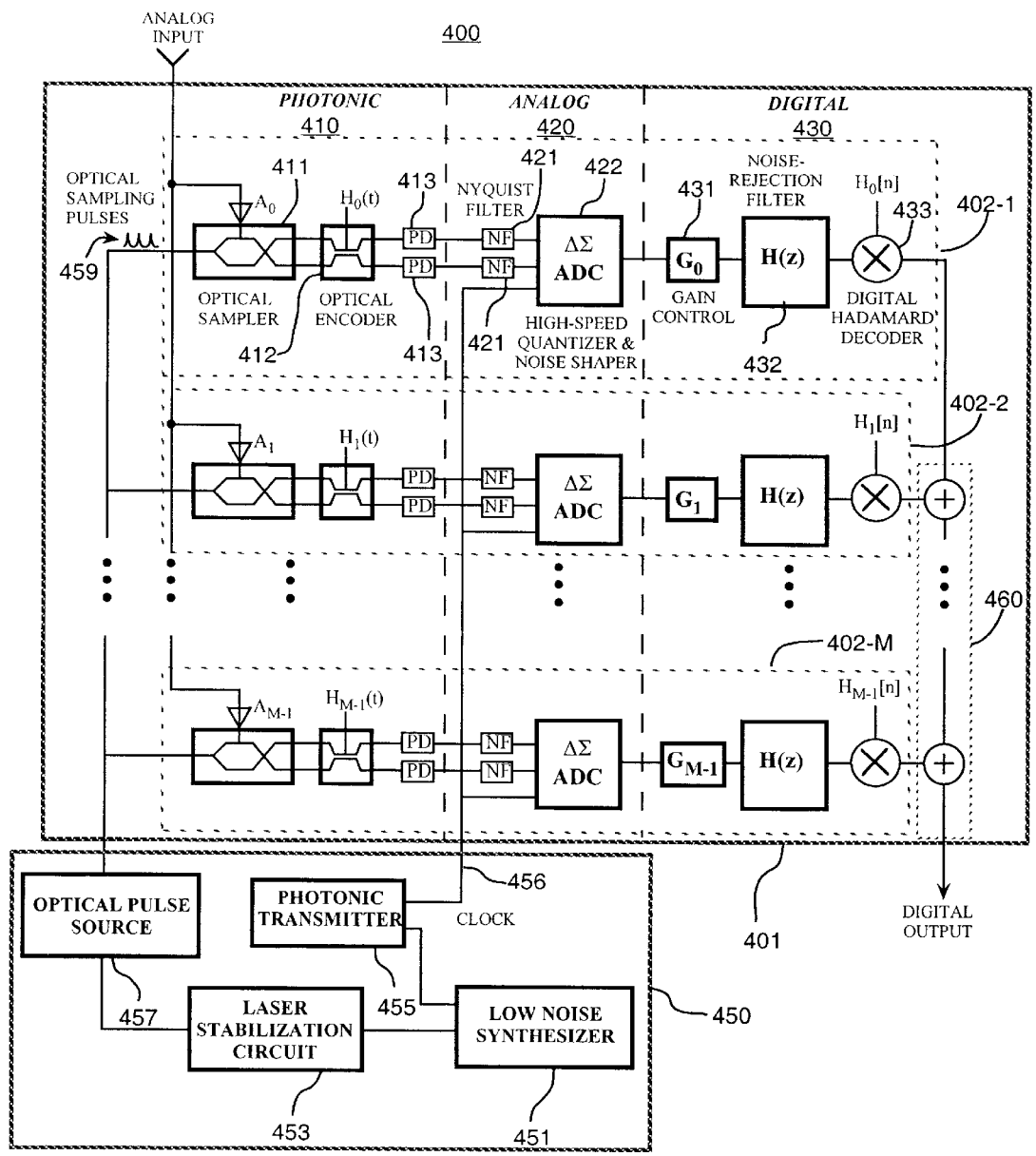
FIG. 4 illustrates an architecture for a photonically sampled parallel channel analog-to-digital converter in accordance with one embodiment of the present invention.

A first embodiment of a parallel photonic ADC system 400 according to the present invention is illustrated in FIG. 4. In FIG. 4, an optical pulse source block 450 provides optical sampling pulses 459 to a parallel channel block 401. The parallel channel block 401 contains M channels 402-1 . . . 402-M that are arranged in parallel. Each channel 402-1 . . . 402-M comprises 3 sections—a photonic section 410, an analog electronics section 420, and a digital electronics section 430. The optical pulse source block 450 comprises a low noise synthesizer 451, a laser stabilization circuit 453, a photonic transmitter 455, and a optical pulse source 457. Preferably, the optical pulses from the optical pulse source have picosecond pulse durations, but optical pulses of longer duration may be used as sampling pulses. The low noise synthesizer 451 is used to establish a sampling rate for the system. The synthesizer provides synchronization signals to a laser stabilization circuit 453 and a photonic transmitter 455. The photonic transmitter 455 outputs a clock signal 456 that may be used to control timing circuits within the analog electronics section 420. The laser stabilization circuit controls the optical pulse source 457 to provide the optical sampling pulses 459 that are preferably equally spaced and are of equal amplitude. The optical pulse source 457 may be a mode-locked laser, fiber laser, semiconductor laser, or other devices known in the art that provide optical sampling pulses.

In the photonic section 410, the optical sampling pulses 459 are divided (in power) into each of the ADC channels 402-1 . . . 402-M. These pulses 459 are then input to an optical encoding sampler circuit comprising a pair of electro-optical modulators. In FIG. 4, the first electro-optical modulator comprises a Mach-Zehnder interferometer 411 with dual output ports and the second electro-optical modulator comprises an optical directional coupler switch 412. The Mach-Zehnder interferometers 411 serve as photonic samplers. The analog input signal is divided among the parallel ADC channels 402-1 . . . 402-M, amplified, and then applied to the Mach-Zehnder interferometers 411. The dual outputs of the Mach-Zehnder interferometers 411 are then applied to the inputs of directional coupler switches 412 which also receive electrical control signals that are preferably coded with distinct Hadamard sequences $H_0(t)$ . . . $H_{M-1}(t)$. There is a different Hadamard sequence for each ADC channel 402-1 . . . 402-M. The Hadamard sequences have values of +1 or −1 and can be supplied to the directional coupler switches 412 as square-wave or sinusoidal waveforms. As a result of the modulation by the Hadamard-coded waveform, an optical pulse representing the sampled signal exits the directional coupler switch 412 from either the first output port, which represents a +1 coded sampled pulse, or the second output port, which represents a -1 coded sampled pulse.

The optical pulses that are output from the cascaded configuration of Mach-Zehnder interferometer 411 and directional coupler switch 412 have an intensity corresponding to the sampled analog value and a sign (positive or negative) corresponding to a Hadamard code. The dual optical outputs of each directional coupler switch 412 are fed to an optical to electrical converter that produces a differential representation of the sampled and encoded analog signal. Preferably, the optical to electrical converter comprises a pair of photodetectors 413, which output electrical currents. The frequency response of the photodetectors 413 is preferably greater than the pulse repetition frequency (PRF) of the optical sampling pulses. Such photodetectors are known in the art.

The differential signal provided by the electrical current outputs from the photodetectors is eventually directed to a differential amplifier, which, in the embodiment shown in FIG. 4, is located in the quantizer 422. The use of the differentially connected pair of photodetectors 413 has the effect of reducing common-mode noise such as that due to the laser relative-intensity noise (RIN). As shown in FIG. 4, the outputs of the photodetectors, which represent the sampled and coded analog value, are first directed to Nyquist filters 421. Alternatively, the photodetector outputs may be directed to electronic HOLD circuits to extend the duration of time for which the sampled value remains accurate, so that the timing accuracy for the clock, which controls the subsequent quantizer 422, need not be as precise. The Nyquist filters 421 could be located in several other places, such as between a differential amplifier and the quantizer 422. The bandwidth of the Nyquist filters is also preferably greater than the optical sampling PRF. If the bandwidth of the Nyquist filters or the response of the photodetectors is less than the PRF, pulse-to-pulse cross-talk will occur, which reduces the number of bits of resolution provided by the analog-to-digital converter according to the present invention. Likewise, the electronic HOLD circuits in the alternative embodiment of the present invention described above are preferably capable of being set and cleared at a rate greater than that of the optical sampling PRF to limit pulse-to-pulse cross-talk.

Figure 1:
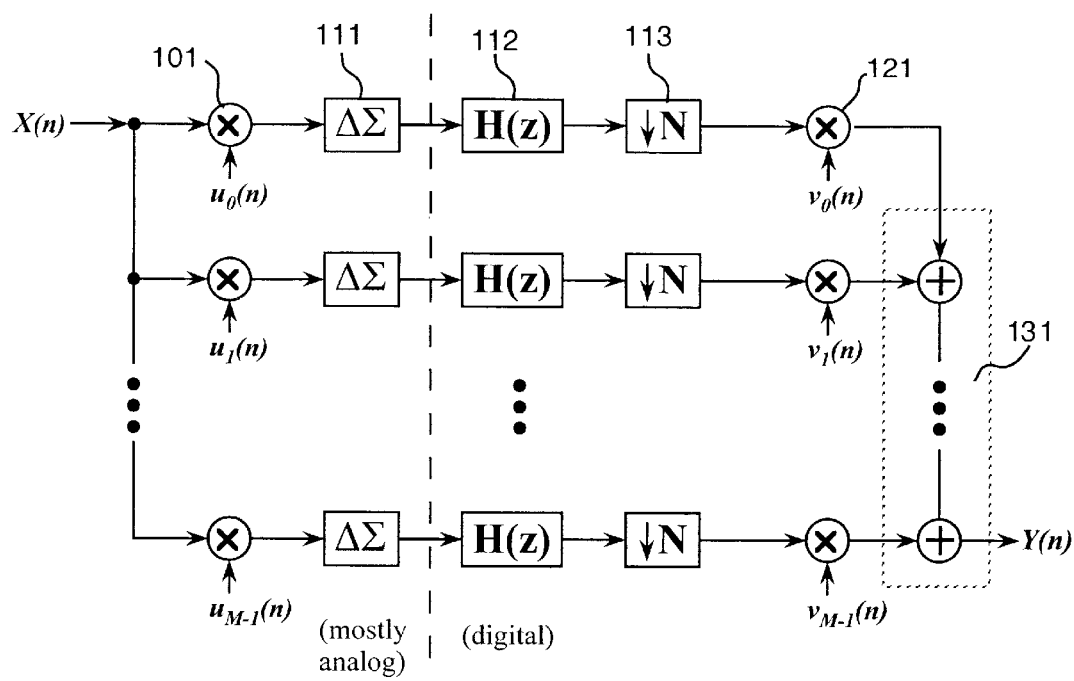
FIG. 1 (prior art) shows a block diagram for an electronic parallel delta-sigma modulator-based analog-to-digital converter.
Figure 2:
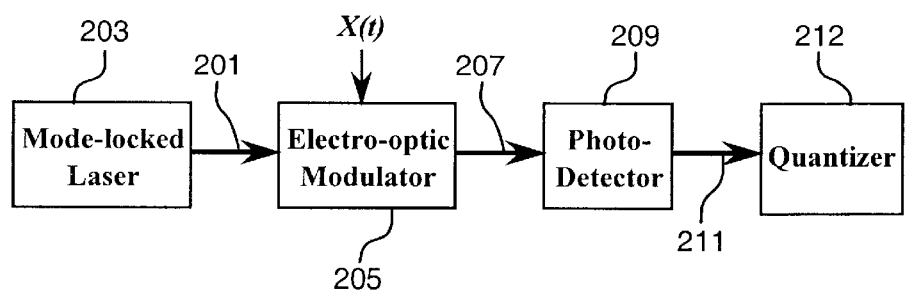
FIG. 2 (prior art) shows a block diagram for a photonically sampled analog-to-digital converter.
Figure 3:
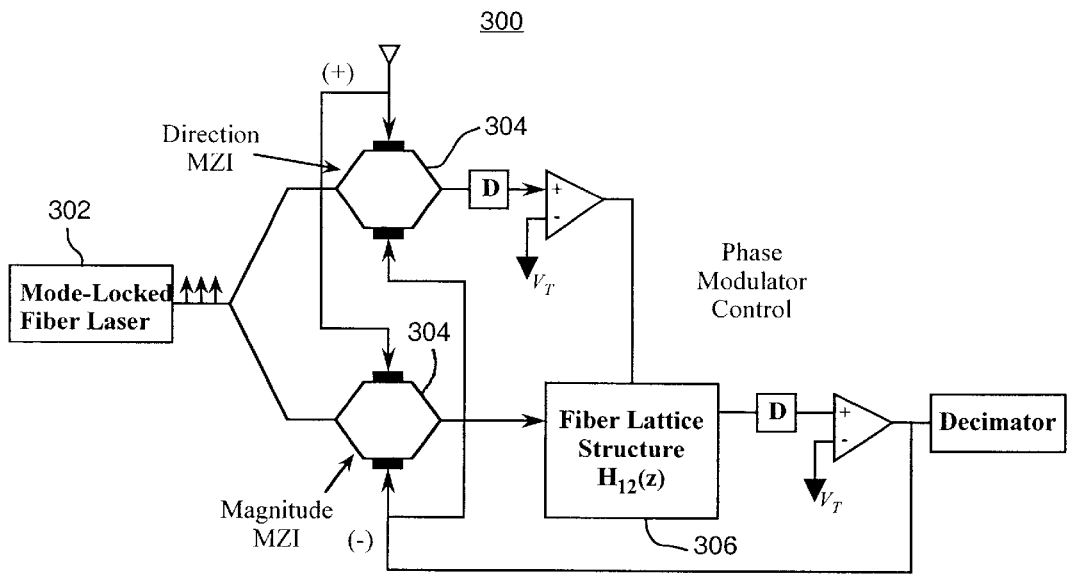
FIG. 3 (prior art) shows a block diagram for a photonically sampled delta-sigma modulator based analog-to-digital converter.
Figure 5:
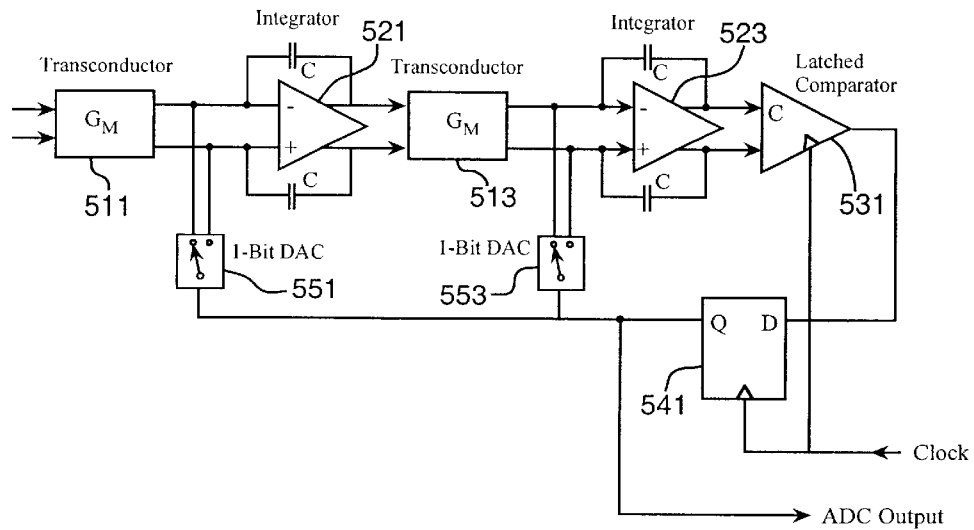
FIG. 5 (prior art) shows a block diagram for a second order delta-sigma modulator.

The analog electronic section 420 of the A/D converter system consists of the Nyquist filters 421 (or HOLD circuits) described above and a high-speed quantizer 422, which converts the discrete-time analog values into digital values. Various designs of converters well known in the art, such as flash ADCS, may used for the quantizer 422 and these converters may have one-bit resolution or multiple bits of resolution. Preferably, a delta-sigma modulator-based ADC is used due to its capability for noise-shaping, as described earlier. An exemplary delta-sigma modulator circuit is shown in FIG. 5, which is based on the ΔΣ modulator disclosed by J. F. Jenson. G. Raghavan, A. E. Cosand, and R. H. Walden in "A 3.2 GHz Second-Order Delta-Sigma Modulator Implemented in InP HBT Technology," IEEE Journal of Solid-State Circuits, Vol. 30, No. 10, Oct. 1995, pp. 1119–1127, and incorporated herein by reference. FIG. 5 shows a second order delta sigma modulator consisting of two transconductance cells 511, 513 and two integrators 521, 523 in the forward path, two 1-bit digital-to-analog convertors (DACs) 551, 553 in the feedback path, a latched comparator 531 to quantize the signal, and a D flip-flop 541 to drive the current switched DACs 551, 553. Note that the circuit shown in FIG. 5 receives the signal to be converted as a differential signal, as is provided by the photodetector pair 413 of the first embodiment of the present invention.

The digital electronic section 430 of the A/D converter system follows the analog electronic section 420 and consists of first set of gain control elements 431. Generally, the gain control values $G_0 \ldots G_{M-1}$ will have the same values, but may vary to adjust for known imbalances between the channels 402-1 . . . 402-M. The gain control elements 431 may also apply fixed weights to the channels 402-1 . . . 402-M for cancellation of spurs produced in the sampling process. The gain control elements 431 are followed by a set of digital noise rejection filters 432 that function to remove noise and can have a bandwidth that is smaller than the analog signal band. These filters are described in a paper by Galton and Jensen (IEEE Trans. Circuits and Systems 11, v. 42, p. 773, 1995). The noise rejection filters 432 are followed by a set of digital multipliers 433 which demodulate the filtered signals with time-delayed versions of the Hadamard codes used to encode the sampled analog signal. A digital summer 460 then sums the demodulated signals to form the digital output of the ADC system. The digital output may then be further processed to remove any noise spurs.

In the embodiment of the invention depicted in FIG. 4, the analog input signal is divided evenly to supply identical waveforms to each channel, therefore the analog signal gain values $A_0 \ldots A_{M-1}$ have, preferably, the same value. These input waveforms provide the modulation signal for the parallel channels 402-1 . . . 402-M. Lack of balance between the channels will degrade the resolution of the ADC by producing unwanted spurs. If a lack of balance is present, the gain values $A_0 \ldots A_M$- at each optical sampler 411 may be adjusted to improve the channel balance. In this embodiment, Hadamard modulation provides coding that only changes the sign of the input values. Other embodiments of the present invention may use code sequences other than Hadamard sequences.

The primary sources of noise from the photonic sampling process are intensity noise of the laser, shot noise from photodetectors and thermal noise from amplifiers. The laser intensity noise is suppressed by the use of the dual photodetectors in each of the parallel channels. The parallel architecture enhances the signal-to-noise performance of the photonic ADC system by suppressing the shot and thermal noise. Those noise components in each channel sum incoherently. Thus, in comparison to the combination of a photonic sampler and an electronic parallel delta-sigma ADC, for which there is no suppression of the sampler noise, the averaging of the parallel architecture of this invention suppresses the photonic sampling noise by 3 dB (one-half bit resolution) for each doubling in the number of parallel channels. Furthermore, the digital noise rejection filter 432 can be designed to reduce the noise even more. Since multiple samplers are used in this embodiment, any non-uniformity between them will result in fixed-pattern distortions at the output. These distortions can be minimized by dynamically changing the Hadamard codes for each pair of optical encoding sampler and digital decoder. This changing or reassignment of the Hadamard codes has the effect of randomizing the channels.

The performance of the photonic ADC described above is limited by the spur-free dynamic range of the optical modulators 411, 412. Any noise or spurs that result from the sampling process is indistinguishable from the desired analog input, since the sampling is done prior to and outside of the quantizer 422. As described above, use of the preferred delta-sigma modulator in the quantizer 422 only lowers the quantization noise. Thus, the noise shaping and spectral filtering provided by a delta-sigma modulator affects only the quantization error, but not the errors associated with the modulators 411, 412. The resolution of the ADC can be improved somewhat by digital correction of the non-linear transfer function of the electro-optical modulators 411, 412. Such digital correction typically requires knowledge of the higher-harmonic content of the modulator outputs. Access to this higher-harmonic output may require photodetectors 413 with a wider bandwidth than just greater than the optical sampling PRF. Preferably, the photodetectors 413 have a bandwidth of three to seven times greater than that of the sampled analog signal. This wider bandwidth provides access to the third or fifth order harmonics of the sampled analog signal. However, the extent of the improvement provided by digital correction is limited for wideband inputs because the response of wideband photodetectors (photodetectors with a bandwidth of three to seven times that of a high frequency analog signal) typically becomes non-linear at the higher optical input powers necessary for distinguishing a large dynamic range.

Another approach to modulator linearization is based on the use of two parallel Mach-Zehnder modulators. The non-linearity of one modulator is used to cancel the distortion products produced by another modulator. The optical and electrical inputs are divided between the two modulators according to specific ratios in order to achieve cancellation of the third-order intermodulation products. A limitation of this approach is that those ratios must be controlled to accuracies of 1% or better, depending on the signal bandwidth. The values of the electrical inputs can be adjusted by controlling the gains of amplifiers or attenuators that drive each of the modulators. The values of the optical inputs are more difficult to control and would require adjusting the coupler that feed the modulators. Rather than relying on control of analog input values, digital gain elements may be used to control the value of the digitized versions of the optically sampled signals so that the precise ratio of signals required for noise suppression is obtained.

Another embodiment of the present invention uses an architecture derived from the use of parallel optoelectronic modulators. In this embodiment, the analog input is divided among the parallel channels according to a prescribed rule. The ratios of the magnitudes of these divided inputs are set to achieve cancellation of the intermodulation products that arise from the non-linear transfer function of the Mach-Zehnder interferometer. Known procedures can be used to determine these ratios and have been described in papers by Bridges and Schaffner, "Distortion In Linearized Electrooptic Modulators," IEEE Trans. On Microwave Theory and Techniques v. 43, p. 2184, 1995, and by Korotky and de Ridder, "Dual Parallel Modulation Schemes for Low-Distortion Analog Optical Transmission," IEEE J. on Selected Areas in Communication, v. 8, p. 1377, 1990. In one exemplary design of dual, parallel Mach-Zehnder modulators, the ratio of the analog electrical inputs is 2.62: 1. The ratio of the optical inputs is 1: 17.913 6.

Figure 6:
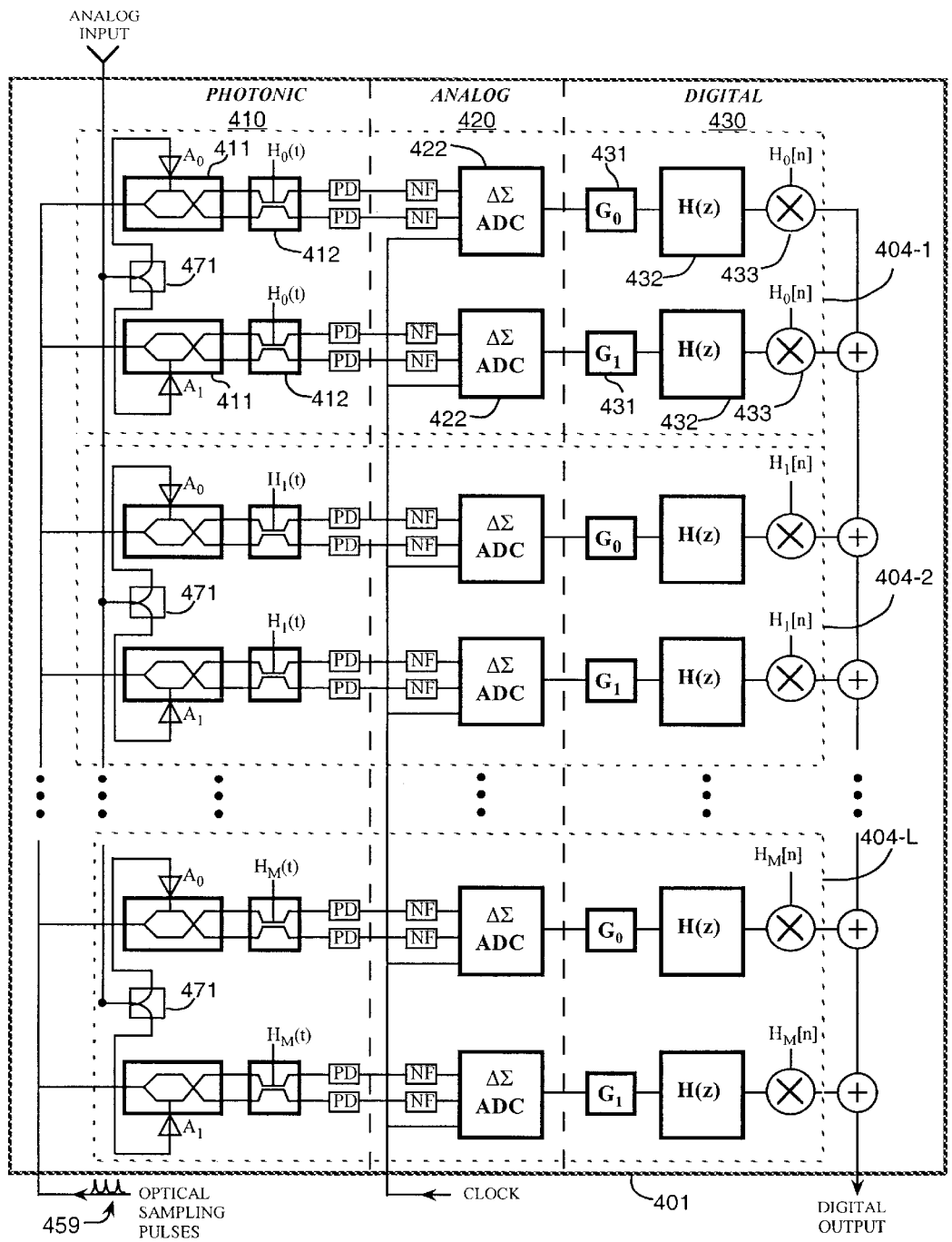
FIG. 6 illustrates an architecture for a photonically sampled parallel channel analog-to-digital converter in accordance with another embodiment of the present invention configured to reduce sampler induced noise.

FIG. 6 shows the parallel channel block 401 according to this second embodiment of the present invention. The parallel channels are grouped into L pairs 404-1 . . . 404-L of channels, where L equals the number of individual channels divided by 2. The ratio of the analog inputs can be achieved by using a 1-to-2 power divider 471 and then attenuating (or amplifying) the input of one channel. Preferably, the same ratio is used for the pairs of channels in each parallel channel 404-1 . . . 404-L. The analog inputs to adjacent channels are applied to alternating arms of the interferometers 411 so that each interferometer 411 in each pair of individual channels operates at a 180° phase shift with respect to the other. This phase shift may also be achieved in other ways, such as by biasing each pair of modulators at two different quadrature points that are shifted by 180°, by applying the code signal $H_0 \ldots H_M$ at opposite electrodes of the directional coupler switches 412, or by applying code signals $H_0 \ldots H_M$ that are opposite in sign at the pairs of directional coupler switches 412 of each parallel channel 404-1 . . . 404-L. The desired result is to produce a sign reversal between the digital signals output by the digital filter 432 in the first channel and the digital filter 432 in the second channel in each channel pair 404-1 . . . 404-L.

The precision required for the optical inputs cannot be achieved readily by using an optical splitter or directional coupler. The embodiment depicted in FIG. 6 divides the optical power equally among the channels 404-1 . . . 404-L. The precise ratios of the effective optical powers in the individual channels are achieved by setting the gains $G_0$, $G_1$ of the digital gain elements 431 that come after the quantizers 422. Preferably, the gains $G_0, G_1$ are the same in each channel pair 404-1 . . . 404-L. However, as discussed above, the gain elements 431 may also be used to compensate for any non-uniformities in the optical power division before the samplers 411, and thus the gain values $G_0$, $G_1$ may differ among the channel pairs 404-1 . . . 404-L.

Figure 7:
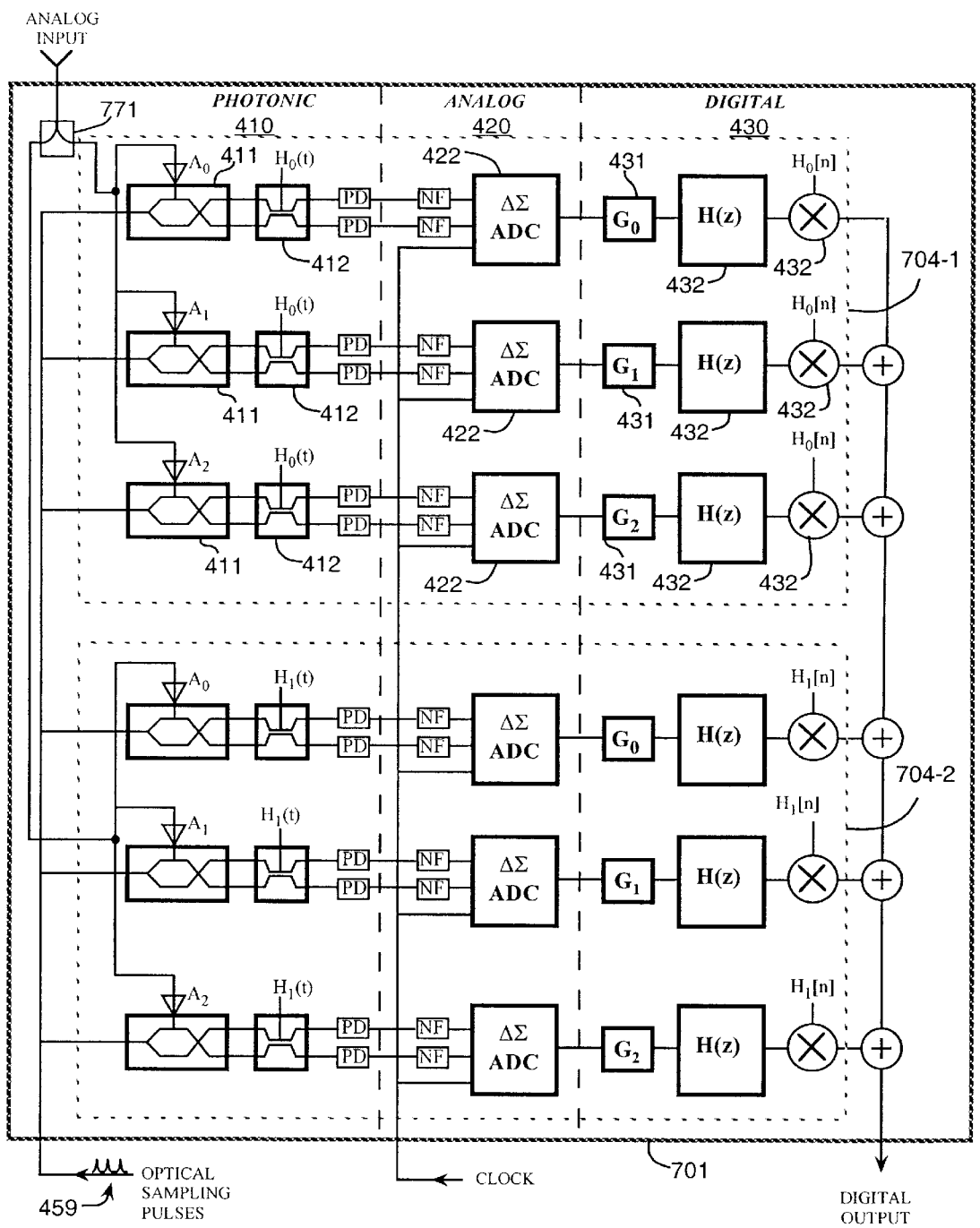
FIG. 7 shows a block diagram for six channel analog-to-digital converter system in accordance with the present invention configured to reduce third order intermodulation products.

In the analog-to-digital converter architecture depicted in FIG. 6 and described above, the second channel in each channel pair provides for the cancellation of one order of distortion terms. This technique can be used in alternative embodiments of the present invention, by using additional channels in each channel group to cancel higher orders of distortion products. In another embodiment of the present invention, for cancellation of higher intermodulation products, the parallel sampler channels are grouped in groups of three channels. An example of this embodiment is shown in FIG. 7 for a parallel channel block 701 with two groups of three channels. A power divider 771 splits the analog signal between the two groups of channels 704-1, 704-2. Within each channel group 701-1, 704-2, the analog signal is applied to the optical samplers 411 with different ratios $A_0, A_1$, $A_2$. One difficulty, however, with correcting these higher-order intermodulation products is that the needed division of the analog input power becomes very uneven. For example, the inputs to 3 individual channels shown in the channel groups 701-1, 704-2 in FIG. 7 are preferably divided with power ratios of 0.0394: 0.3136: 0.6470. Again, the digital gain elements 431 may be used to help establish these precise ratios and compensate for any non-uniformities in the optical power division before the samplers 411.

Figure 8:
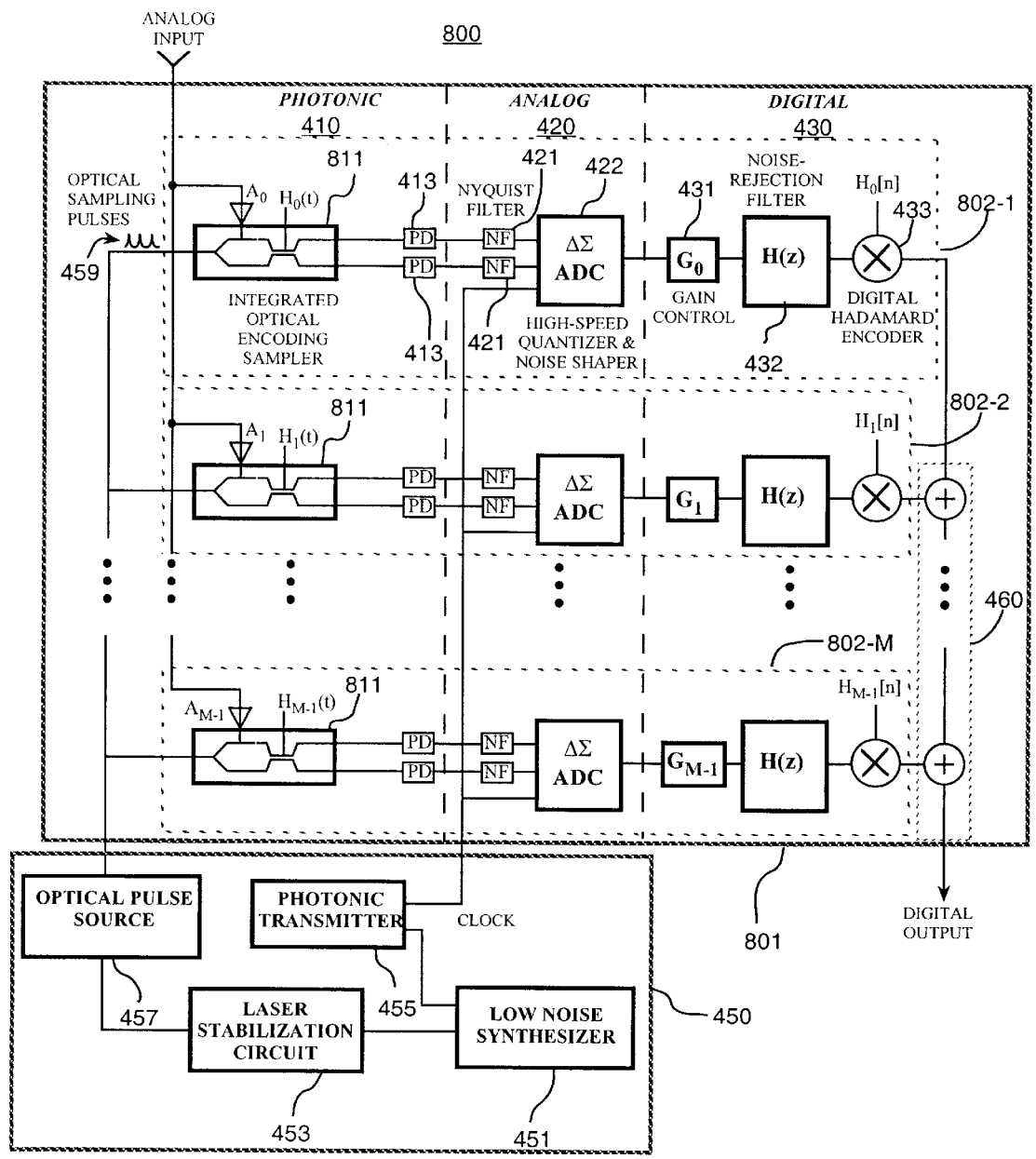
FIG. 8 illustrates an architecture for a photonically sampled parallel channel analog-to-digital converter utilizing encoding samplers in the parallel channels.

For the embodiments described above, each optical encoding sampler circuit is described as comprising a dual-output Mach-Zehnder interferometer (the sampler) that is cascaded with a directional-coupler switch (the Hadamard encoder), as shown in FIGS. 4, 6, and 7. However, an integrated optical encoding sampler 811 that achieves both sampling and Hadamard encoding may be used in place of the cascade of the Mach-Zehnder interferometer 411 with the directional coupler switch 412. FIG. 8 shows a block diagram of an analog-to-digital converter according to the present invention in which an integrated optical encoding sampler 811 is used. Embodiments of the integrated optical encoding sampler 811 are described in the patent application "Photonic Encoding Sampler," Ser. No. 09/848498. The integrated optical encoding sampler 811 provides the capability of performing the sampling and encoding functions with a device on a single substrate, which simplifies the construction of the analog-to-digital converter according to the present invention. This encoding sampler may be used in place of the Mach-Zehnder interferometer 411 and directional coupler switch 412 in any of the embodiments previously described.

Figure 9:
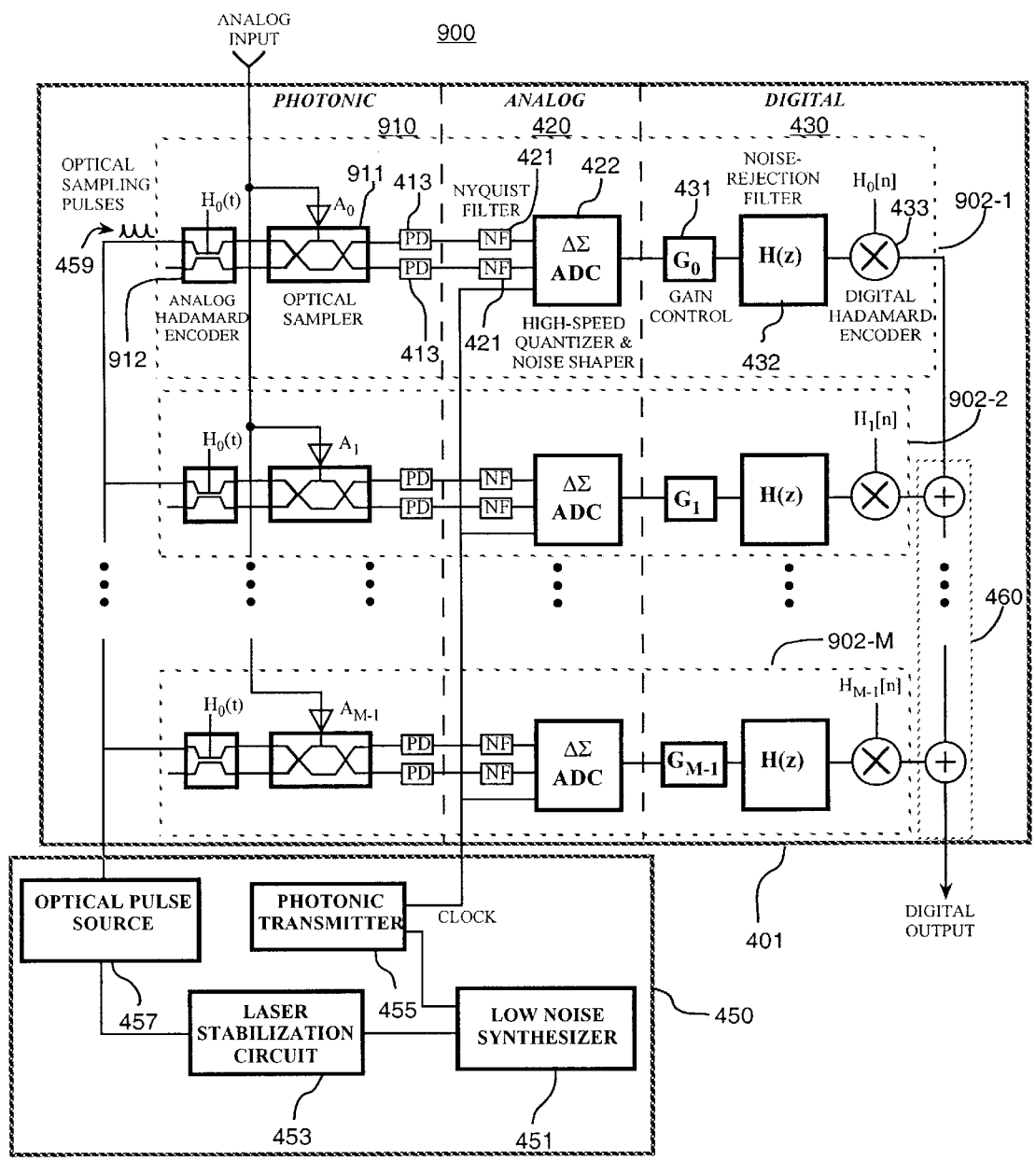
FIG. 9 illustrates an architecture for a photonically sampled parallel channel analog-to-digital converter in which coded optical sampling pulses sample the analog waveform.

In the embodiments of the present invention described above, the optical sampler 411 sampled the analog input directly with the optical sampling pulses 459. The sampled optical pulses output by the optical sampler 411 are then encoded by the optical encoder 412. However, another alternative embodiment of the present invention provides that the analog signal may be sampled with an encoded optical signal. A block diagram of this embodiment is shown in FIG. 9. In FIG. 9, the optical sampling pulses 459 are coupled first to one of the inputs of a dual input, dual output directional coupler switch 912 contained in each channel 902-1 . . . 902-M. Preferably, the other input of each directional coupler switch 912 is left unconnected, since the directional coupler switch 912 is used to route the optical sampling pulses 459 to either output of the directional coupler switch 912. Each directional coupler switch 912 is controlled by an encoding signal $H_0 \ldots H_{M-1}$. The dual outputs of the directional coupler switch 912 are coupled to the inputs of a dual input, dual output optical sampler 911. The optical sampler 911 is preferably a Mach-Zehnder interferometer controlled by the analog input. The remainder of each channel 902-1 . . . 902-M has the same configuration as described above. In this embodiment as in the other embodiments described above, the inputs to the photodetectors 413 in each channel still comprise a differential representation of the optically sampled and coded analog signal. The embodiment depicted in FIG. 9 essentially allows a dual input, dual output modulator to be substituted for the single input, dual output modulators described above.

From the foregoing description, it will be apparent that the present invention has a number of advantages, some of which have been described above, and others of which are inherent in the embodiments of the invention described herein. Also, it will be understood that modifications can be made to the analog-to-digital converter and the method for analog to digital conversion described above without departing from the teachings of subject matter described herein. As such, the invention is not to be limited to the described embodiments except as required by the appended claims.

What is claimed is:

1. An analog to digital converter having an analog input and a digital output, said analog to digital converter comprising:
   an optical pulse source;
   a plurality of channels, each channel comprising:
      an optical encoding sampler circuit, coupled to said optical pulse source and said analog input, sampling said analog input to produce a sampled optical signal and encoding said sampled optical signal with a encoding code sequence to produce an encoded optical signal;

an optical to electric converter, coupled to said optical encoding sampler, converting said encoded optical signal to an electronic signal;

a quantizer, coupled to said optical to electric converter, producing a digital signal from said electronic signal; and a digital decoder, coupled to said quantizer, decoding said digital signal with a decoding code sequence to produce a decoded digital signal; and a summer, coupled to said digital decoder in each channel of said plurality of channels, digitally summing each decoded digital signal from each channel to produce said digital output.

2. An analog to digital converter according to claim 1, further comprising a Nyquist filter in each channel of said plurality of channels, said Nyquist Filter positioned between said optical to electric converter and said quantizer, and having an input coupled to said optical to electric converter and an output coupled to said quantizer.

3. An analog to digital converter according to claim 1, further comprising a gain element in each channel of said plurality of channels, said gain element located between said quantizer and said digital decoder, said gain element digitally modifying an amplitude of a digital signal output by said quantizer.

4. An analog to digital converter according to claim 1, further comprising a digital noise filter in each channel of said plurality of channels, said digital noise filter located between said quantizer and said digital decoder, said digital noise filter digitally filtering a digital signal output by said quantizer.

5. An analog to digital converter according to claim 3, wherein said gain element digitally modifies the amplitude of the digital signal to improve linearity and to decrease noise spurs in the digital output.

6. An analog to digital converter according to claim 3, wherein said channels in said plurality of channels are grouped as channel pairs and said analog input is divided between the optical encoding sampler circuits in each channel pair according to a first prescribed ratio and the two optical encoding sampler circuits are controlled to produce sampled optical signals with a phase shift of 180° between the sampled optical signals of the two optical encoding sampler circuits, and the gain elements in each channel pair digitally modify the amplitude of the digital signal output in each channel in the pair according to a second prescribed ratio.

7. An analog to digital converter according to claim 6, wherein said gain elements compensate for the division of the analog input between the optical encoding sampler circuits so as to improve linearity and decrease noise spurs in the digital output.

8. An analog to digital converter according to claim 3, wherein said channels in said plurality of channels are grouped as one or more channel groups, each channel group comprising two or more channels, and said analog input is divided between the channels in each channel group according to a prescribed ratio, and the gain elements in each channel adjust a channel signal output to maintain the prescribed ratio.

9. An analog to digital converter according to claim 1, wherein said optical encoding sampler circuit comprises:

a single input, dual-output Mach-Zehnder interferometer, the single input of the Mach-Zehnder interferometer coupled to the optical pulse source; and a directional coupler switch coupled to the outputs of the Mach-Zehnder interferometer.

10. An analog to digital converter according to claim 1, wherein said optical encoding sampler circuit comprises:

a directional coupler switch having two inputs and two outputs, one of the inputs being coupled to the optical pulse source; and a dual input, dual-output Mach-Zehnder interferometer, the dual inputs of the Mach-Zehnder interferometer coupled to the outputs of the directional coupler switch.

11. An analog to digital converter according to claim 1, wherein said optical encoding sampler circuit comprises an integrated optical encoding sampler.

12. An analog to digital converter according to claim 1, wherein said optical to electrical converter is a photodetector.

13. An analog to digital converter according to claim 1, wherein said encoding code sequence is a Hadamard sequence and said decoding code sequence is a Hadamard sequence.

14. An analog to digital converter according to claim 1, wherein digital decoder comprises a digital multiplier which multiplies said digital signal by said decoding code sequence.

15. An analog to digital converter according to claim 1, wherein the quantizer comprises a delta-sigma modulator-based analog-to-digital conversion circuit.

16. An analog to digital converter having an analog input and a digital output, the analog to digital converter comprising:

means for producing optical pulses;

a plurality of channels, each channel comprising:
means for sampling and encoding the analog input with the optical pulses, thereby producing an encoded optical signal;
means for converting the encoded optical signal to an electric signal;
means for quantizing the electric signal, thereby producing a digital signal; and
means for decoding the digital signal with a decoding code sequence, thereby producing a decoded digital signal; and means for summing together each decoded digital signal from each channel in the plurality of channels, thereby producing the digital output.

17. An analog to digital converter according to claim 16, wherein the means for sampling and encoding the analog input comprises:

a dual output Mach-Zehnder interferometer coupled to the optical pulses and controlled by the analog input; and a directional coupler switch coupled to the outputs of the Mach-Zehnder interferometer and controlled by an encoding signal.

18. An analog to digital converter according to claim 16, wherein the means for sampling and encoding the analog input comprises:

a directional coupler switch coupled to the optical pulses and controlled by an encoding signal; and a dual input, dual output Mach-Zehnder interferometer coupled to the outputs of the directional coupler switch and controlled by the analog input.

19. An analog to digital converter according to claim 16, wherein the means for sampling and encoding the analog input comprises an integrated optical encoding sampler.

20. An analog to digital converter according to claim 16, further comprising means for filtering the electric signal.

21. An analog to digital converter according to claim 16, further comprising means for filtering the digital signal.

22. An analog to digital converter according to claim 16, wherein said analog signal is encoded with a Hadamard sequence.

23. An analog to digital converter according to claim 16, wherein the means for quantizing the electric signal comprises a delta-sigma modulator.

24. An analog to digital converter according to claim 16, wherein the means for decoding the digital signal comprises a digital multiplier, the digital multiplier multiplying the digital signal by a decoding code sequence.

25. An analog to digital converter according to claim 16, further comprising means for digitally adjusting the digital signal.

26. An analog to digital converter according to claim 25, wherein said channels in said plurality of channels are grouped as channel pairs and said analog input is divided between the means for sampling and encoding the analog input in each channel pair according to a first prescribed ratio and the means for sampling and encoding the analog input are controlled to produce sampled optical signals with a phase shift of 180° between the sampled optical signals of the means for sampling and encoding the analog input, and the means for digitally adjusting the digital signal in each channel pair digitally modify the amplitude of the digital signal in each channel in the pair according to a second prescribed ratio.

27. An analog to digital converter according to claim 26, wherein said means for digitally adjusting the digital signal compensates for the division of the analog input between the optical encoding sampler circuits so as to improve linearity and decrease noise spurs in the digital output.

28. An analog to digital converter according to claim 26, wherein said channels in said plurality of channels are grouped as one or more channel groups, each channel group comprising two or more channels, and said analog input is divided between the channels in each channel group according to a prescribed ratio, and said means for digitally adjusting the digital signal in each channel adjust a channel signal output to maintain the prescribed ratio.

29. A method for converting an analog input signal to a digital output signal comprising the steps of:
   providing optical pulses;
   coupling the optical pulses to a plurality of converter channels;
   converting the optical pulses coupled to each channel converter channel to encoded optical samples of the analog input signal
   converting the encoded optical samples to an electric signal in each converter channel;
   quantizing the electric signal to produce a quantized digital signal in each converter channel;
   decoding the quantized digital signal with a decoding code sequence to produce a decoded digital signal in each converter channel; and
   summing together all the decoded digital signals from each converter channel to produce the digital output signal.

30. The method according to claim 29, wherein the step of converting the optical pulses further comprises the steps of:
   sampling the analog input signal with the optical pulses to produce a sampled optical signal in each converter channel; and
   encoding the sampled optical signal with an encoding code sequence to produce encoded optical samples in each converter channel.

31. The method according to claim 29, wherein the step of converting the optical pulses further comprises the steps of:
   encoding the optical pulses with an encoding code sequence to produce encoded optical pulses in each of the converter channels; and
   sampling the analog input signal with the encoded optical pulses to produce encoded optical samples in each of the converter channels.

32. The method according to claim 29, further comprising the step of filtering the electric signal in each channel.

33. The method according to claim 29, further comprising the step of digitally filtering the quantized digital signal in each converter channel.

34. The method according to claim 29, wherein said quantized digital signal has a value and said method further comprises the step of digitally increasing or decreasing the value of said quantized digital signal in each converter channel.

35. The method according to claim 34, wherein said converter channels in said plurality of converter channels are grouped as channel pairs and said method further comprises the steps of:
   dividing said analog input into a first analog input and a second analog input, said first analog input and said second analog input having magnitudes differing according to a first prescribed ratio;
   applying said first analog input to one converter channel of each channel pair;
   applying said second analog input to the other converter channel of each channel pair with a 180° phase shift in relation to the first analog input; and
   digitally increasing or decreasing the value of the quantized digital signal in one converter channel of the channel pair in relation to the quantized digital signal in the other converter channel of the channel pair according to a second prescribed ratio.

36. The method according to claim 35, further comprising the step of digitally increasing or decreasing the value of the quantized digital signal of at least one of the converter channels of each channel pair to compensate for errors in dividing said analog input into a first analog input and a second analog input.

37. The method according to claim 34, wherein said converter channels in said plurality of converter channels are grouped as one or more channel groups, each channel group comprising two or more converter channels, and said method further comprises the steps of:
   dividing said analog input into two or more divided analog inputs, each of said divided analog inputs having magnitudes differing according to a prescribed ratio;
   applying each one of said divided analog inputs to a corresponding one converter channel in each channel group; and
   digitally increasing or decreasing the value of the quantized digital signal in each converter channel within each channel group to maintain the prescribed ratio.

\* \* \* \* \*